(12) United States Patent
Vashchenko et al.

(10) Patent No.: US 6,560,081 B1
(45) Date of Patent: May 6, 2003

(54) ELECTROSTATIC DISCHARGE (ESD) PROTECTION CIRCUIT

(75) Inventors: Vladislav Vashchenko, Fremont, CA (US); Peter J. Hopper, San Jose, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 282 days.

(21) Appl. No.: 09/690,558

(22) Filed: Oct. 17, 2000

(51) Int. Cl.[7] .............................. H02H 9/00; H02H 9/04; H01L 23/62; H03K 5/08
(52) U.S. Cl. .................... 361/56; 361/111; 257/355; 327/313
(58) Field of Search ..................... 361/56, 91, 111, 361/100, 90; 257/355, 363, 358, 361, 362, 373; 327/525, 313, 318

(56) References Cited

U.S. PATENT DOCUMENTS

| | | | | | |
|---|---|---|---|---|---|
| 3,394,268 A | * | 7/1968 | Murphy | | 326/130 |
| 3,934,159 A | * | 1/1976 | Nomiya et al. | | 327/390 |
| 4,220,876 A | * | 9/1980 | Ray | | 307/296 |
| 4,303,831 A | * | 12/1981 | El Hamamsy | | 250/551 |
| 5,010,380 A | * | 4/1991 | Avery | | 357/34 |
| 5,079,608 A | * | 1/1992 | Wodarczyk et al. | | 361/101 |
| 5,412,527 A | * | 5/1995 | Husher | | 361/56 |

OTHER PUBLICATIONS

G. Croft and J. Bernier, *ESD Protection Techniques for High Frequency Integrated Circuits*, Microelectronics Reliability 38, 1998, pp. 1681–1689 Jul. 9, 1998.

J.Z. Chen et al., *Design and Layout of a High ESD Performance NPN Structure for Submicron BiCMOS–Bipolar Circuits*, 34th Annaul IEEE International Reliability Physics Symposium Proceedings, 1996, pp. 227–232, No Date.

J. C. Bernieret et al., *A Process Independent ESD Design Methodology* IEEE International Sympsium on Circuits and Systems Proceedings 1, 1999, pp. 218–221, No Date.

W.D. Mack et al., *New ESD Protection Schemes for BiCMOS Processes with Application to Cellular Radio Designs*, IEEE International Symposium on Circuits and Systems 6, 1992, pp. 2699–2702.

Ming–Dou Ker et al., *Design on the Low–Leakage Diode String for Using in the Power–Rail ESD Clamp Circuits in a 0.35–um Silicide CMOS Process*, IEEE Transactions on Solid–State Circuits 35, 2000, pp. 601–611.

Julian Z. Chen et al., *Bipolar SCR ESD Protection Circuit for High Speed Submicron Bipolar/BiCMOS Circuits*, IEEE International Electron Devices Meeting Technical Digest, 1995, pp. 337–340.

* cited by examiner

*Primary Examiner*—Rajnikant B. Patel
(74) *Attorney, Agent, or Firm*—Mark C. Pickering

(57) ABSTRACT

An ESD protection circuit that can be easily configured to provide ESD event protection against a range of ESD event voltages. The circuit is also compatible with high frequency ICs. The ESD protection circuit includes an input terminal configured to receive an ESD event signal and a diode sub-circuit. The diode sub-circuit includes at least one diode (e.g., either a single diode or a plurality of diodes connected in series or parallel configuration), a diode input node and a diode output node. The diode sub-circuit is configured to receive an ESD event signal from the input terminal and to operate under forward bias conditions to provide a diode output signal at the diode output node. The circuit also includes a bipolar junction transistor (e.g., a Si—Ge bipolar junction transistor) with a base, a collector and an emitter. The emitter is configured to receive the ESD event signal from the input terminal, while the base is configured to receive the diode output signal from the diode output node. A resistor, with a resistor input node, a resistor output node and an output terminal, is also included in the circuit. The resistor input node is electrically connected to the diode output node and the output terminal is connected to the resistor output node, the emitter and ground. By predetermining the electrical characteristics (e.g., forward bias voltage) and number of diodes in the diode sub-circuit, the circuit can be adapted to provide ESD protection against a range of ESD event voltages.

15 Claims, 2 Drawing Sheets

ELECTROSTATIC DISCHARGE (ESD) PROTECTION CIRCUIT

BACKGROUND OF THE INVENTION

1. Field of the Invention

The present invention relates to semiconductor device circuits and, in particular, to electrostatic discharge protection circuits for use with integrated circuits.

2. Description of the Related Art

A major reliability problem for integrated circuits is the provision of adequate protection against Electrostatic Discharge (ESD) or other excess voltage events. Therefore, specialized ESD protection devices (also known as ESD protection circuits) are commonly employed in an integrated circuit (IC) to protect electronic devices in the IC from spurious pulses of excessive voltage (i.e., an ESD event, Human Body Model [HBM] event, or Electrical Overstress [EOS] event). See,. for example, S. M. Sze, *Electrostatic Discharge Damage,* in VLSI Technology, 648–650 (McGraw Hill, 1988). A variety of conventional ESD protection devices that make extensive use of diodes, metal-oxide semiconductor field effect transistors (MOSFETs) and bipolar transistors are known in the field.

Conventional bipolar transistor-based ESD protection devices include, for example, bipolar transistor-based transient and bipolar transistor-based static ESD protection devices (e.g., grounded base bipolar transistor-based ESD protection devices and Zener Triggered bipolar transistor-based ESD protection devices). Descriptions of these and other conventional ESD protection devices are available in G. Croft and J. Bernier, *ESD Protection Techniques for High Frequency Integrated Circuits,* Microelectronics Reliability 38, 1681–1689 (1998); J. Z. Chen et al., *Design and Layout of a High ESD Performance NPN Structure for Submicron BiCMOS/Bipolar Circuits,* 34th Annual IEEE International Reliability Physics Symposium Proceedings, 227–232 (1996); J. C. Bernier et al., *A Process Independent ESD Design Methodology,* IEEE International Symposium on Circuits and Systems Proceedings 1, 218–221 (1999); W. D. Mack et al., *New ESD Protection Schemes for BiCMOS Processes with Application to Cellular Radio Designs,* IEEE International Symposium on Circuits and Systems 6, 2699–2702 (1992); Ming-Dou Ker et. Al., *Design on the Low-Leakage Diode String for Using in the Power-Rail ESD Clamp Circuits in a 0.35-µm Silicide CMOS Process,* IEEE Transactions on Solid-State Circuits 35, 601–611 (2000); and Julian Z. Chen et al., *Bipolar SCR ESD Protection Circuit for High Speed Submicron Bipolar/BiCMOS Circuits,* IEEE International Electron Devices Meeting Technical Digest, 337–340 (1995), each of which is hereby fully incorporated by reference.

FIG. 1 is an electrical schematic illustrating a conventional Zener Triggered bipolar transistor-based ESD protection circuit. This conventional Zener Triggered bipolar transistor-based ESD protection circuit requires the use of a Zener diode that essentially operates in avalanche breakdown (although true Zener tunneling breakdown will occur prior to avalanche breakdown). The Zener diode must, therefore, possess an avalanche breakdown voltage equivalent to the voltage of the ESD event against which the circuit is protecting. For example, if the Zener diode is a 6V Zener diode, the circuit can protect against an ESD event voltage of 6 volts or higher. The conventional Zener Triggered bipolar transistor-based ESD protection circuit cannot, therefore, be easily adjusted to provide ESD event protection against ESD event voltages other than those equal to or greater than its Zener diode avalanche breakdown voltage.

Still needed in the field, therefore, is an ESD protection circuit that is easily configured to provide ESD event protection against a range of ESD event voltages. The ESD protection circuit should also be compatible with high frequency ICs.

SUMMARY OF THE INVENTION

The present invention provides an ESD protection circuit that can be easily configured to provide ESD event protection against a range of ESD event voltages. The ESD protection circuit is also compatible with high frequency ICs.

ESD protection circuits according to the present invention include an input terminal configured to receive an ESD event signal and a diode sub-circuit. The diode sub-circuit includes at least one diode, a diode input node and a diode output node. The diode sub-circuit is configured to receive the ESD event signal from the input terminal and to operate under forward bias conditions to provide a diode output signal at the diode output node.

ESD protection circuits according to the present invention also include a bipolar junction transistor (e.g., a Si—Ge bipolar junction transistor [BJT]) with a base, a collector and an emitter. The emitter is configured to receive the ESD event signal from the input terminal, while the base is configured to receive the diode output signal from the diode output node. Also included are a resistor with a resistor input node, a resistor output node and an output terminal. The resistor input node is electrically connected to the diode output node and the output terminal is electrically connected to the resistor output node, the emitter and ground.

By predetermining the number, the electrical characteristics (e.g., forward bias voltage) and the electrical interconnection of the diodes, the circuit can be adapted to provide ESD protection against a range of ESD event voltages. Since high frequency BJTs can be employed in the ESD protection circuit, an ESD protection circuit according to the present invention is also compatible for use with high frequency ICs.

BRIEF DESCRIPTION OF THE DRAWINGS

A better understanding of the features and advantages of the present invention will be obtained by reference to the following detailed description that sets forth illustrative embodiments, in which the principles of the invention are utilized, and the accompanying drawings, of which:

FIG. 3A illustrates the operation of an ESD protection circuit with one diode and FIG. 3B illustrates the operation of an ESD protection circuit with 5 diodes, where $V_c$ is collector voltage, $V_B$ is base voltage, $I_c$ is collector current and $I_B$ is base current.

DETAILED DESCRIPTION OF THE INVENTION

Figure 1:
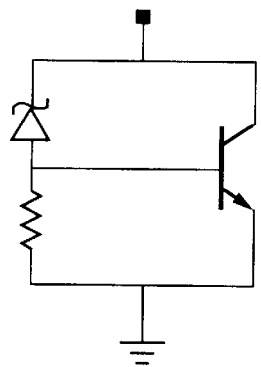
FIG. 1 is an electrical schematics of a conventional Zener Triggered bipolar transistor-based ESD protection device.
Figure 2:
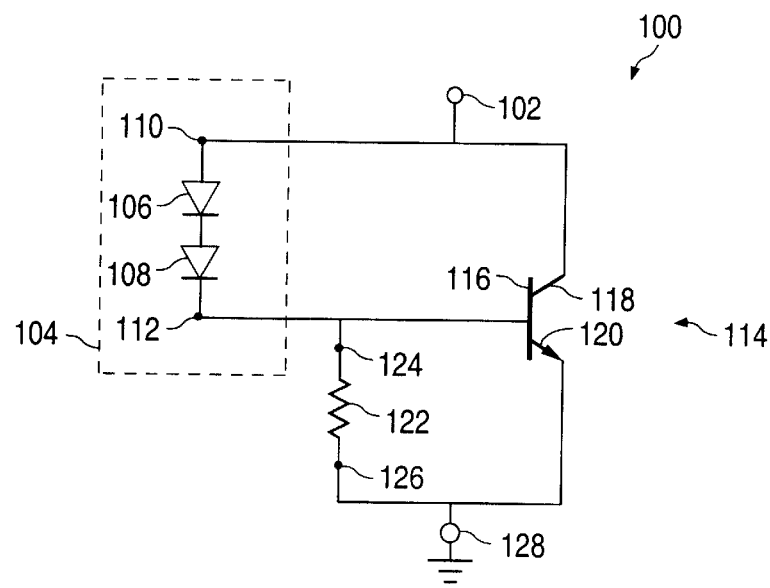
FIG. 2 is an electrical schematic illustrating an ESD protection circuit according to the present invention.

FIG. 2 illustrates an ESD protection circuit 100 according to the present invention. ESD protection circuit 100 includes an input terminal 102 configured to receive an ESD event signal. The ESD event signal can be, for example, an ESD event signal originating from a power supply line in an IC or any other ESD/EOS event signal encountered by an IC.

ESD protection circuit 100 also includes a diode sub-circuit 104 (delineated by dashed lines in FIG. 2). Diode sub-circuit 104 includes two diodes 106, and 108 connected in series, a diode input node 110 and a diode output node 112. The diode sub-circuit 104 is configured to receive the ESD event signal from the input terminal 102 and operate under forward bias conditions to provide a diode output signal at the diode output node 112.

ESD protection circuit 100 also includes a bipolar junction transistor (BJT) 114 with a base 116, a collector 118 and an emitter 120. The collector 118 is electrically connected to the input terminal 102 and is, therefore, configured to receive an ESD event signal from the input terminal 102. The base 116 is electrically connected to the diode output node 112 and is, therefore, configured to receive a diode output signal from the diode output node 112.

The BJT employed in ESD protection devices according to the present invention can be any suitable BJT known to one skilled in the art. However, when an ESD protection circuit according to the present invention is to be used in conjunction with high frequency ICs (e.g., high frequency BiCMOS integrated circuits), it is preferred that the BJT be a Si—Ge BJT that is (i) capable of operating at a high frequency and (ii) capable of developing a high on-state current under injection operating conditions.

Although the embodiment of FIG. 2 includes two diodes connected in series, the diode sub-circuit in ESD protection circuits according to the present invention can include any number of diodes connected in any configuration (e.g., in series or parallel). The number and electrical characteristics of the diodes in the diode sub-circuit are predetermined to induce a voltage (i.e., a diode output signal) on the base of the BJT sufficient to switch the BJT to an on-state when an ESD event occurs, as well as to provide the ESD protection circuit with a desired ESD event voltage protection capability. Depending on the level of current provided by the ESD event signal, the transient behavior of the diode sub-circuit will produce a current through the diode(s) that is adequate to support a bias on the base of the BJT. This bias switches the BJT to an on-state. In other words, the total forward voltage drop across the diode sub-circuit determines the minimum ESD event voltage, against which the ESD protection circuit protects. This diode sub-circuit behavior can result in a fast (i.e., around 1 nano-second) switching of the BJT to an on-state.

One skilled in the art will recognize that the electrical characteristics (e.g., forward bias breakdown voltage) of a diode depends on its dopant profile and dopant concentration. However, any given diode has a characteristic forward bias voltage at which it operates. For example, if this forward bias voltage is 1 V, then the use of one such diode in the diode sub-circuit can provide the ESD protection circuit with the capability to protect against ESD event voltages of 1 V and higher (although this depends also on the BJT's collector current and voltage limitations). In such a circumstance, when the ESD event signal at the input terminal exceeds 1 V, the diode sub-circuit will provide a diode output signal that induces a bias on the base of the BJT and the BJT will begin to conduct current to ground and dissipate the ESD event. Similarly, the use of two such diodes (connected in series) will protect against a 2 volt ESD event and the use of twenty such diodes (connected in series) will protect against a 20V ESD event.

Therefore, ESD protection circuits according to the present invention can be easily configured to provide ESD event protection against a range of ESD event voltages by simply predetermining the number, forward bias voltage and interconnection configuration (e.g., a series or parallel configuration) of the diodes in the diode sub-circuit. Furthermore, the ESD protection capability of ESD protection circuits according to the present invention is more stable than conventional Zener diode-based ESD protection circuits since the forward bias operation of diodes is more stable than their avalanche breakdown operation.

Also included in ESD protection circuit 100 is a resistor 122 (e.g., a 100 ohm resistor) with a resistor input node 124, a resistor output node 126 and an output terminal 128. The resistor input node 124 is connected to the diode output node 112, and the resistor output node 126 is connected to the output terminal 128. The output terminal 128 is also connected to the emitter 120 of the BJT 114 and to ground. The resistor 122 provides a path for minority current to drain from the base 116 of the BJT 114 to ground, thereby avoiding multiplication of the minority carrier current in the base 116. This function of the resistor 122 beneficially increases the breakdown voltage of the BJT 114.

Figure 3A:
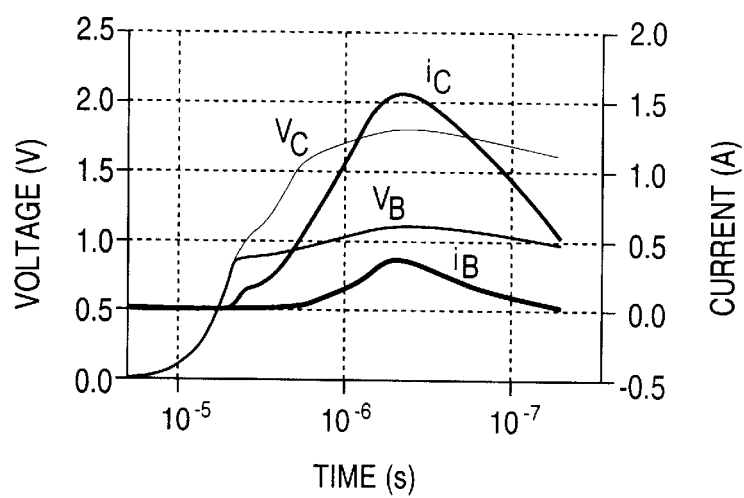
FIGS. 3A and 3B are graphs of voltage (left-hand y-axis) and current (right-hand y-axis) versus time illustrating the operation of ESD protection circuits according to the present invention during an HBM event.
Figure 3B:
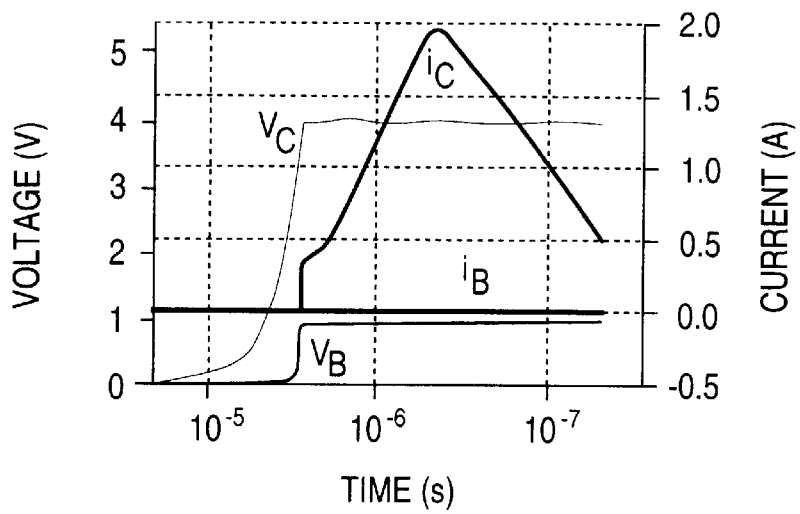

FIGS. 3A and 3B are graphs of voltage (left-hand y-axis) and current (right-hand y-axis) versus time illustrating the operation of ESD protection circuits according to the present invention during an HBM event (i.e., a 1.5 KeV event with a rising time of 10 nano-seconds and a falling time of 150 nano-seconds). FIG. 3A illustrates the operation of an ESD protection circuit with one 100 square micron diode and FIG. 3B illustrates the operation of an ESD protection circuit with five 100 square micron diodes connected in series. The $V_c$ (collector voltage) curves of FIGS. 3A and 3B indicate ESD event voltage protection capabilities of approximately 1.8V and 4V, respectively. These results demonstrate the ability to adjust the ESD protection capability of ESD protection circuits according to the present invention by predetermining the number of diodes in the diode sub-circuit.

Figure 4:
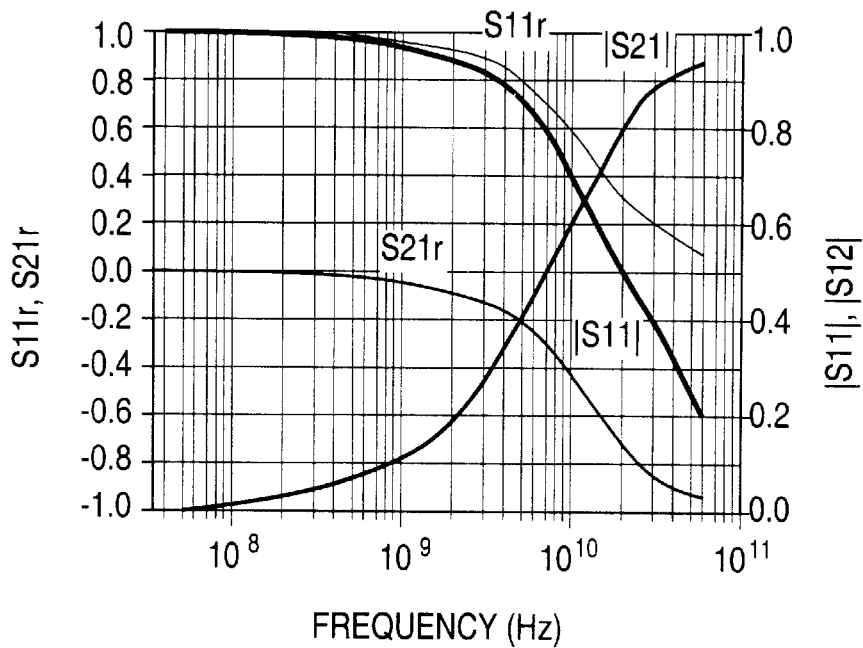
FIG. 4 illustrates the RF-signal performance of an ESD protection circuit according to the present invention.

FIG. 4 illustrates the RF signal performance (i.e., the "S" parameters) of an ESD protection device according to the present invention that includes a high frequency BJT (i.e., a BJT capable of operating at over 8 GHz). FIG. 4 demonstrates that the RF signal reflection (determined from curves S11 and S11r) is around 20% at 7 GHz to 8 GHz (namely, the 1 dB compression point corresponds to approximately 7 GHz–8 GHz). The ESD protection circuit is, therefore, suitable for use with high frequency ICs operating at approximately 7 GHz or less.

One skilled in the art will recognize that ESD protection circuits according to the present invention can be easily integrated into BiCMOS integrated circuits, including high frequency (e.g., 5 to 7 GHz) BiCMOS integrated circuits and that the diode sub-circuit, bipolar junction transistor and resistor can be formed as a monolithic integrated circuit in and on a semiconductor substrate (e.g., a silicon or SOI substrate).

It should be understood that various alternatives to the embodiments of the invention described herein may be employed in practicing the invention. It is intended that the following claims define the scope of the invention and that structures within the scope of these claims and their equivalents be covered thereby.

What is claimed is:

1. An ESD protection circuit comprising:

an input terminal connected to receive an electrostatic discharge (ESD) voltage when the ESD voltage is present;

a diode sub-circuit that includes a diode, the diode sub-circuit being connected to the input terminal to receive the ESD voltage when the ESD voltage is present, the diode operating under forward bias conditions when the ESD voltage is received to provide a diode output voltage, the diode sub-circuit including no diodes that operate under reverse bias conditions when the ESD voltage is received; and a bipolar junction transistor with a base, a collector and an emitter, the collector being directly connected to the input terminal to receive the ESD voltage when the ESD voltage is present, the base being connected to receive the diode output voltage.

2. The ESD protection circuit of claim 1, wherein the diode sub-circuit includes a plurality of diodes connected in series.

3. The ESD protection circuit of claim 2, wherein the plurality of diodes includes two diodes.

4. The ESD protection circuit of claim 2, wherein the plurality of diodes includes at least five diodes.

5. The ESD protection circuit of claim 1, wherein the bipolar junction transistor is a high frequency Si—Ge bipolar junction transistor capable of operating at least 7 GHz.

6. The ESD protection circuit of claim 1, wherein the diode sub-circuit includes a plurality of diodes connected in parallel configuration.

7. The circuit of claim 1 and further comprising a resistor connected between the base of the transistor and ground.

8. The ESD protection circuit of claim 7, wherein the diode sub-circuit, bipolar junction transistor and resistor are formed as a monolithic integrated circuit in and on a semiconductor substrate.

9. The ESD protection circuit of claim 7, wherein the resistor is a 100 ohm resistor.

10. An ESD protection circuit comprising:

an input terminal connected to receive an electrostatic discharge (ESD) voltage when an ESD voltage is present;

a diode circuit that includes a diode, the diode circuit being connected to the input terminal to receive the ESD voltage when the ESD voltage is present, the diode operating under forward bias conditions when the ESD voltage is received to provide a diode output voltage, the diode circuit including no diodes that operate under reverse bias conditions when the ESD voltage is received; and a bipolar junction transistor with a base, a collector, and an emitter, the base being connected to receive the diode output voltage, the collector being connected to the input terminal via a connection path to receive the ESD voltage when the ESD voltage is present, the connection path being free of resistors.

11. The circuit of claim 10 and further comprising a resistor connected between the base of the transistor and ground.

12. The circuit of claim 10 wherein the diode sub-circuit includes a plurality of diodes.

13. An ESD protection circuit comprising:

an input terminal connected to receive an electrostatic discharge (ESD) voltage when an ESD voltage is present;

a diode circuit that includes a diode, the diode circuit being connected to the input terminal to receive the ESD voltage when the ESD voltage is present, the diode operating under forward bias conditions when the ESD voltage is received to provide a diode output voltage, the diode circuit including no diodes that operate under reverse bias conditions when the ESD voltage is received; and a bipolar junction transistor with a base, a collector, and an emitter, the base being connected to receive the diode output voltage, the collector being connected to the input terminal via a connection path to receive the ESD voltage when the ESD voltage is present, the connection path being free of diodes.

14. The circuit of claim 13 and further comprising a resistor connected between the base of the transistor and ground.

15. The circuit of claim 13 wherein the diode sub-circuit includes a plurality of diodes.

\* \* \* \* \*

UNITED STATES PATENT AND TRADEMARK OFFICE
CERTIFICATE OF CORRECTION

PATENT NO.     : 6,560,081 B1
DATED          : May 6, 2003
INVENTOR(S)    : Vashchenko et al.

It is certified that error appears in the above-identified patent and that said Letters Patent is hereby corrected as shown below:

Title page,
Item [56], References Cited, delete "Annaul" and replace with -- Annual --; and delete "Sympsium" and replace with -- Symposium --.

Column 2,
Line 24, delete "Si___Ge" and replace with -- Si-Ge --.

Column 3,
Line 27, delete "Si___Ge" and replace with -- Si-Ge --.

Signed and Sealed this

First Day of July, 2003

JAMES E. ROGAN
*Director of the United States Patent and Trademark Office*